United States Patent
Zepeda et al.

(10) Patent No.: US 10,221,500 B2
(45) Date of Patent: Mar. 5, 2019

(54) SYSTEM FOR FORMING AN INGOT INCLUDING CRUCIBLE AND CONDITIONING MEMBERS

(71) Applicant: SunEdison, Inc., Maryland Heights, MO (US)

(72) Inventors: Salvador Zepeda, St. Peters, MO (US); Richard J. Phillips, St. Peters, MO (US); Christopher Vaughn Luers, O'Fallon, MO (US); Steven Lawrence Kimbel, St. Charles, MO (US); Harold W. Korb, Chesterfield, MO (US); John D. Holder, Knoxville, TN (US); Carissima Marie Hudson, St. Charles, MO (US); Hariprasad Sreedharamurthy, Ballwin, MO (US); Stephan Haringer, Kastelbell (IT); Marco Zardoni, Merano (IT)

(73) Assignee: Corner Star Limited, Kowloon (HK)

( * ) Notice: Subject to any disclaimer, the term of this patent is extended or adjusted under 35 U.S.C. 154(b) by 0 days.

(21) Appl. No.: 15/398,407

(22) Filed: Jan. 4, 2017

(65) Prior Publication Data

US 2018/0187329 A1    Jul. 5, 2018

(51) Int. Cl.
| | | |
|---|---|---|
| *C30B 15/12* | (2006.01) | |
| *C30B 15/20* | (2006.01) | |
| *C30B 15/00* | (2006.01) | |
| *C30B 15/02* | (2006.01) | |
| *C30B 29/06* | (2006.01) | |

(52) U.S. Cl.
CPC ............ *C30B 15/20* (2013.01); *C30B 15/002* (2013.01); *C30B 15/02* (2013.01); *C30B 15/12* (2013.01); *C30B 29/06* (2013.01)

(58) Field of Classification Search
CPC ....... C30B 15/00; C30B 15/002; C30B 15/02; C30B 15/10; C30B 15/12; C30B 15/20; Y10T 117/00; Y10T 117/10; Y10T 117/1024; Y10T 117/1032; Y10T 117/1052
USPC ..... 117/11, 13, 19–20, 30–31, 33, 200, 206, 117/208, 213, 928, 931–932
See application file for complete search history.

(56) References Cited

U.S. PATENT DOCUMENTS 4,497,777 A * 2/1985 Kojima ................... C30B 15/04
                                                                 117/208
5,871,581 A    2/1999 Atami et al.
(Continued)

FOREIGN PATENT DOCUMENTS

JP    H02233582 A    9/1990

OTHER PUBLICATIONS

International Search Report and Written Opinion of the International Search Authority regarding PCT/US2018/012320 dated Mar. 26, 2018; pp. 1-15.

*Primary Examiner* — Kenneth A Bratland, Jr.
(74) *Attorney, Agent, or Firm* — Armstrong Teasdale LLP

(57) ABSTRACT

Systems and methods for forming an ingot from a melt are disclosed. A system includes a crucible defining a cavity for receiving the melt, and a first and second barrier to inhibit movement of the melt. A first passageway and a second passageway are arranged to allow the melt located within an outer zone to move into and through a transition zone and into an inner zone. Conditioning members are placed in at least one of the zones and arranged to contact the melt to reduce the number of micro-voids in the melt.

11 Claims, 21 Drawing Sheets

(56) References Cited

U.S. PATENT DOCUMENTS

2014/0144371 A1* 5/2014 Swaminathan ......... C30B 15/14
 117/13
2014/0261155 A1* 9/2014 Kimbel ................... C30B 15/12
 117/31

* cited by examiner

SYSTEM FOR FORMING AN INGOT INCLUDING CRUCIBLE AND CONDITIONING MEMBERS

FIELD

This disclosure generally relates to monocrystalline pulling systems for forming ingots of semiconductor or solar material from a melt and more particularly to systems and methods including a crucible and conditioning members disposed within a cavity of the crucible to contact the melt.

BACKGROUND

In the production of silicon monocrystals grown by the Czochralski (CZ) method, polycrystalline silicon is melted within a crucible, such as a quartz crucible, of a crystal pulling device to form a silicon melt. A puller lowers a seed crystal into the melt and slowly raises the seed crystal out of the melt, solidifying the melt onto the seed crystal to form an ingot.

In a continuous CZ method, polycrystalline silicon is added to the melt while the seed crystal is raised out of the melt. The addition of polycrystalline silicon may generate micro-voids in the melt. The micro-voids generally have diameters less than 10 micrometers. The micro-voids in the melt may be incorporated into the ingot during formation of the ingot. Prior continuous Czochralski systems have not succeeded in eliminating these micro-voids. Thus, there exists a need for a more efficient and effective system and method to control characteristics of the melt and to eliminate inclusion of micro voids in the ingot.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a system for forming an ingot from a melt includes a crucible defining a cavity for receiving the melt and a first barrier disposed in the cavity to inhibit movement of the melt. The crucible and the first barrier form an outer zone. The first barrier includes a first passageway. The system also includes a second barrier disposed in the cavity to inhibit movement of the melt from outward of the second barrier to inward of the second barrier. The first barrier and the second barrier define a transition zone therebetween. The second barrier forms an inner zone and includes a second passageway. The first passageway and the second passageway are arranged to allow the melt located within the outer zone to move into and through the transition zone and into the inner zone. The system further includes conditioning members positioned in the transition zone between the first barrier and the second barrier. The conditioning members are arranged to contact the melt in the transition zone and reduce the number of micro-voids in the melt.

In another aspect, a system for forming an ingot from a melt includes a crucible assembly defining a cavity for receiving the melt. The cavity is separated into an inner zone, an outer zone, and a transition zone. The inner zone defines a growth area for the ingot. The system also includes a feeder system to deliver solid feedstock material into the cavity. The solid feedstock material is arranged to form the melt. The system further includes bodies positioned in the outer zone of the cavity. The bodies are arranged to contact the solid feedstock material and the melt and reduce the number of micro-voids in the melt.

In another aspect, a method for pulling a crystal ingot from a melt in a crystal pulling system is described. The system includes a crucible defining a cavity. The method includes placing quartz bodies within the cavity and placing feedstock material into the cavity. The method also includes melting the feedstock material to form the melt. A melt line is defined by a surface of the melt. The bodies are arranged at the melt line to contact the melt and reduce the number of micro-voids in the melt.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

DETAILED DESCRIPTION

Figure 1:
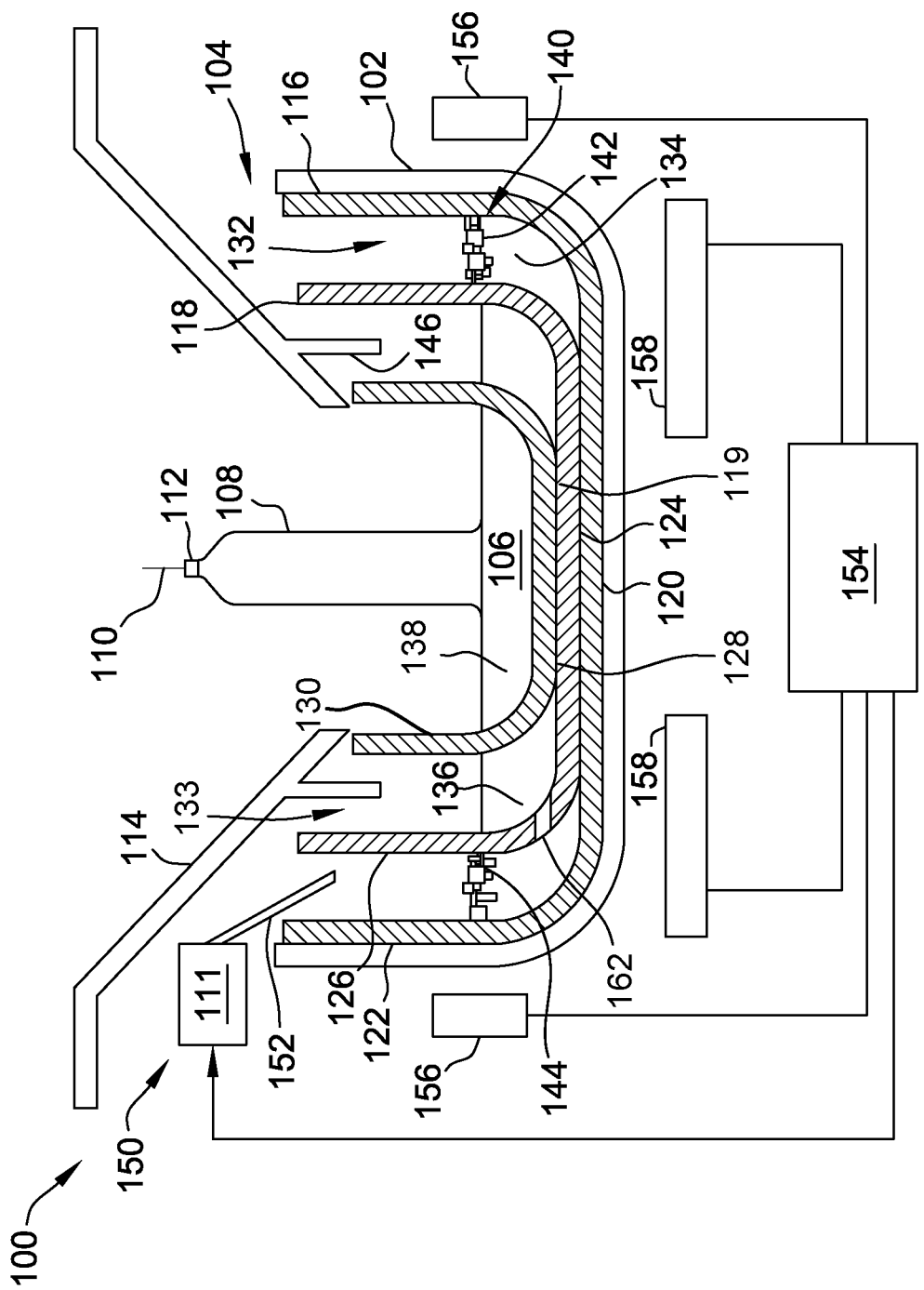
FIG. 1 is a schematic illustration of a crystal pulling system.

Referring to FIG. 1, a crystal pulling system is shown schematically and is indicated generally at 100. Crystal pulling system 100 may be used to produce an ingot by a Czochralski method.

The illustrated crystal pulling system 100 includes a susceptor 102 supporting a crucible assembly 104 that contains a melt 106 of semiconductor or solar grade material (e.g., silicon). Melt 106 may be formed by heating a solid feedstock material 111. During operation of system 100, a seed crystal 112 is lowered by a puller 110 into melt 106 and then slowly raised from melt 106. As seed crystal 112 is slowly raised from melt 106, silicon atoms from melt 106 align themselves with and attach to seed crystal 112 to form an ingot 108. The illustrated system 100 also includes a heat shield 114 to shield ingot 108 from radiant heat from melt 106 and allow ingot 108 to solidify.

Crucible assembly 104 includes a first crucible 116, a second crucible 118, and a third crucible 119. In further embodiments, system 100 may include one or more weirs in addition to or in place of any of first crucible 116, second crucible 118, and third crucible 119. In suitable embodiments, crucible assembly 104 may be constructed of any suitable material that enables system 100 to function as described. For example, in some embodiments, crucible assembly 104 may be constructed of quartz.

First crucible 116 includes a first base 120 and a first sidewall 122. Second crucible 118 includes a second base 124 and a second sidewall 126. Third crucible 119 includes a third base 128 and a third sidewall 130. In the illustrated embodiment, first sidewall 122 extends around the circumference of first base 120 and second sidewall 126 extends around the circumference of second base 124. Third sidewall 130 extends around the circumference of third base 128. A first cavity 132 is formed by first sidewall 122 and first base 120 of first crucible 116. A second cavity 133 is formed by second sidewall 126 and second base 124 of second crucible 118. In other embodiments, crucible assembly 104 may include any crucible that enables system 100 to operate as described.

First crucible 116, second crucible 118, and third crucible 119 may have any shape that enables system 100 to operate as described herein. For example, in some embodiments, first crucible 116, second crucible 118, and/or third crucible 119 may include a curved base having any suitable curvature.

In this embodiment, first crucible 116, second crucible 118, and third crucible 119 are sized and shaped to allow placement of second crucible 118 and third crucible 119 within cavity 132 of first crucible 116. In addition, first crucible 116, second crucible 118, and third crucible 119 are sized and shaped to allow placement of third crucible 119 within second cavity 133 of second crucible 118. Each of first crucible 116, second crucible 118, and third crucible 119 may have any suitable diameter that enables system 100 to operate as described. In some embodiments, first crucible 116, second crucible 118, and third crucible 119 may have diameters of 40, 36, 32, 28, 24, 20, 22, or 16-inches. For example, in some embodiments, first crucible 116 may have an external diameter of 36-inches, second crucible 118 may have an external diameter of 22-inches, and third crucible 119 may have an external diameter of 16-inches.

First crucible 116, second crucible 118, and third crucible 119 form an outer zone 134, a transition zone 136, and an inner zone 138. Outer zone 134 is formed in cavity 132 between first sidewall 122 and second sidewall 126. Inner zone 138 is formed within third crucible 119. Transition zone 136 is formed in second cavity 133 between second crucible 118 and third crucible 119. The size of outer zone 134, transition zone 136, and inner zone 138 is determined by the size of first crucible 116, second crucible 118, and third crucible 119. For example, inner zone 138 has a diameter equal to the diameter of third crucible 119. In some embodiments, inner zone 138 has a diameter of at least 16-inches. Moreover, in this embodiment, inner zone 138 is substantially free of barriers and obstructions. As a result, the growth area for ingot 108 may be increased and the distance from the growth area to any barriers, such as third sidewall 130, may be increased in comparison to some known systems. Moreover, inner zone 138 provides a larger free surface area for melt 106 and allows better oxygen release than some known systems.

Second crucible 118 and third crucible 119 extend perpendicular to a surface of melt 106 and form vertical barriers that limit melt 106 flowing from outer zone 134 into inner zone 138. Crucible passageways 162, 164 extend through sidewall 126 of second crucible 118 and sidewall 130 of third crucible 119 for melt 106 to move from outer zone 134 into inner zone 138. Crucible passageways 162, 164 may be positioned along second base 124 to increase the distance that melt 106 travels to move into inner zone 138. In suitable embodiments, second crucible 118 and third crucible 119 may include any suitable number of passageways.

In the illustrated embodiment, a barrier 140 is located in outer zone 134 between first sidewall 122 and second sidewall 126. Barrier 140 extends parallel to a surface of melt 106 and limits movement of melt 106 through outer zone 134 towards inner zone 138. Accordingly, barrier 140 forms a horizontal barrier that limits melt 106 flowing from outer zone 134 into inner zone 138. Barrier 140 includes quartz pieces or more broadly bodies 142 and gaps 144 defined between bodies 142. In operation, melt 106 may flow through gaps 144. In this embodiment, bodies 142 are randomly arranged within outer zone 134 and gaps 144 form a labyrinth or circuitous path for melt 106 to flow through. Accordingly, barrier 140 may slow the movement of melt 106 through outer zone 134. In other embodiments, bodies 142 may be arranged in any manner that enables crystal pulling system 100 to operate as described.

Bodies 142 may act as conditioning members that condition melt 106 and/or feedstock material 111. As used herein, the term "condition" means to change a characteristic of a material, and "conditioning" is used to describe a device that changes a characteristic of the material. For example, during operation of system 100, barrier 140 may change characteristics of melt 106, such as argon content of melt 106 and the number of gas-filled micro-voids within melt 106, and reduce defects in ingot 108.

In suitable embodiments, bodies 142 may have different characteristics than feedstock material 111 to facilitate bodies 142 functioning as described. For example, in some embodiments, bodies 142 may have a greater resistance to heat than feedstock material 111. Accordingly, bodies 142 will remain in a solid state for a longer period of time than feedstock material 111. In some embodiments, bodies 142 may remain substantially solid throughout operation of system 100. In further embodiments, bodies 142 may be constructed of quartz and feedstock material 111 may include chunk polysilicon. In such embodiments, at least some of the bodies 142 may be substantially larger than most of the chunks of feedstock material 111.

In suitable embodiments, bodies 142 may be positioned anywhere in outer zone 134. In this embodiment, bodies 142 are positioned between first sidewall 122 and second sidewall 126 adjacent the surface of melt 106. Also, in this embodiment, bodies 142 are not located within inner zone 138. Precise alignment and positioning of bodies 142 may not be required during assembly of system 100 because bodies 142 may be randomly arranged. In addition, the position of bodies 142 may shift during operation of system 100.

In suitable embodiments, bodies 142 may be buoyant and float close to the surface of melt 106. Moreover, as shown in FIG. 1, bodies 142 may be stacked such that barrier 140 extends above and/or below the surface of melt 106. In suitable embodiments, bodies 142 may extend up to and beyond a melt line of a solid feedstock material 111. In other embodiments, bodies 142 may occupy any portion of system 100 that enables system 100 to operate as described. For example, in some embodiments, bodies 142 may fill outer zone 134.

In this embodiment, bodies 142 are free to move. In other words, bodies 142 are not connected to each other or to crucible assembly 104. As a result, the cost of assembling system 100 may be reduced. Moreover, the reliability of system 100 is increased because bonds that may fail during operation of system 100 are omitted. In other embodiments, at least some bodies 142 may be connected to first crucible 116, second crucible 118, and/or other bodies 142.

Bodies 142 may be placed in system 100 at any suitable time. For example, bodies 142 may be placed in system 100 prior to solid feedstock material 111 being melted. In other embodiments, bodies 142 may be added after solid feedstock material 111 is melted, which may reduce the consumption of bodies 142 during operation of system 100.

During operation of system 100, bodies 142 of barrier 140 may be consumed by melt 106 and it may be necessary to replenish bodies 142 of barrier 140. Accordingly, bodies 142 may be added continuously or intermittently during operation of system 100. In suitable embodiments, bodies 142 may be added to barrier 140 at a rate equal to the rate of consumption of bodies 142. In some embodiments, system 100 may include automated means, such as a feeder system, to add bodies 142. In other embodiments, bodies 142 may be added manually to system 100. In some embodiments, barrier 140 may include bodies 142 that do not need to be replenished. In further embodiments, barrier 140 may include extra bodies 142 to account for any consumption during operation of system 100.

With further reference to FIG. 1, crystal pulling system 100 includes heat shield 114 extending adjacent crucible assembly 104. Heat shield 114 covers a portion of inner zone 138 and all of outer zone 134 to prevent line-of-sight polysilicon projectiles from reaching the inner melt surface during the addition of solid feedstock material 111. Moreover, heat shield 114 prevents gas from outer zone 134 from entering inner zone 138. Heat shield 114 includes a leg 146. Leg 146 extends into cavity 132 between second crucible 118 and third crucible 119. In other embodiments, crystal pulling system 100 may include any suitable heat shield 114 that enables crystal pulling system 100 to operate as described.

Solid feedstock material 111 may be placed or supplied into outer zone 134 from a feeder 150 through a feed tube 152. Feed tube 152 is disposed adjacent first crucible 116 for supplying feedstock material 111 to first crucible 116 at a location that is outward of second crucible 118. Feedstock material 111 has a much lower temperature than the surrounding melt 106. Accordingly, feedstock material 111 absorbs heat from melt 106 as the temperature of feedstock material 111 increases and the solid feedstock material 111 liquefies in outer zone 134 to form an outer melt portion. As solid feedstock material 111 (sometimes referred to as "cold feedstock") absorbs energy from melt 106, the temperature of the surrounding melt 106 falls proportionately to the energy absorbed. Barrier 140 enables solid feedstock material 111 to melt completely within the outer zone and increases the uniformity of melt 106 within the inner zone.

The amount of feedstock material 111 added to crucible assembly 104 is controlled by feeder 150, which is responsive to activation signals from a controller 154. The diameter and growth rate of ingot 108 is precisely determined and controlled by controller 154. The addition of feedstock material 111 may be based on the mass of the silicon in the crucible, which may be determined by measuring the weight or liquid height of the melt.

As solid feedstock material 111 is added to melt 106, the surface of melt 106 may be disturbed. Barrier 140 and second sidewall 126 prevent inward propagation of the disturbances of melt 106. Moreover, barrier 140 slows the movement of solid feedstock material 111 to facilitate solid feedstock material 111 melting completely within the outer zone.

Heat is provided to crucible assembly 104 by heaters 156 and 158 arranged at suitable positions about crucible assembly 104. Heat from heaters 156 and 158 initially melts solid feedstock material 111 and then maintains melt 106 in a liquefied state. Heater 156 is generally cylindrical in shape and provides heat to the sides of the crucible assembly 104. Heater 158 provides heat to the bottom of crucible assembly 104. In some embodiments, heater 158 may be generally annular in shape. In other embodiments, system 100 may include any heaters that enable system 100 to operate as described.

In suitable embodiments, heaters 156 and 158 may be resistive heaters coupled to controller 154, which controllably applies electric current to the heaters to alter their temperature. The amount of current supplied to each of heaters 156 and 158 by controller 154 may be separately and independently chosen to optimize the thermal characteristics of melt 106.

As discussed above, seed crystal 112 is attached to a portion of puller 110 located over melt 106. Puller 110 provides movement of seed crystal 112 in a direction perpendicular to the surface of melt 106 and allows seed crystal 112 to be lowered down toward or into melt 106, and raised up or out of melt 106. To produce a high quality ingot 108, the area adjacent to seed crystal 112/ingot 108 must be maintained free of micro-voids in melt 106 that could be incorporated into ingot 108.

In this embodiment, barrier 140 and second crucible 118 limit the surface disturbances and number of feedstock 111 particles in the area immediately adjacent to seed crystal 112/ingot 108 by limiting the movement of melt 106 from outer zone 134 into the growth area. In addition, barrier 140 eliminates micro-voids in melt 106 such that the growth area is free of micro-voids. The growth area is inward of the second crucible 118 and adjacent to the seed crystal 112/ingot 108.

As shown in FIG. 1, barrier 140 and passageways 162, 164 provide a tortuous path for melt 106 to move from outer zone 134 into inner zone 138. In particular, melt 106 moves through gaps 144 in barrier 140 as melt 106 moves through outer zone 134. Moreover, melt 106 must move through passageways 162, 164 in second crucible 118 to move into inner zone 138. As a result, barrier 140 and second crucible 118 limit movement of melt 106 from zone 134 towards inner zone 138. In addition, any movement of melt 106 from zone 134 into inner zone 138 is spaced from the top of melt 106, where ingot 108 is being pulled, because passageways 162, 164 are located along the bottom of crucible assembly 104. Thus, the position of passageways 162, 164 further limits the passage of solid particles to the growth area of melt 106.

The controlled movement of melt 106 through outer zone 134 and between outer zone 134 and inner zone 138 allows feedstock material 111 in outer zone 134 to heat to a temperature that is approximately equivalent to the temperature of the growth area as feedstock material 111 passes through outer zone 134. Moreover, system 100 may have a larger growth area and produce larger single crystal ingots because the movement of melt 106 is controlled in outer zone 134 and inner zone 138 is free of any barriers.

Figure 2:
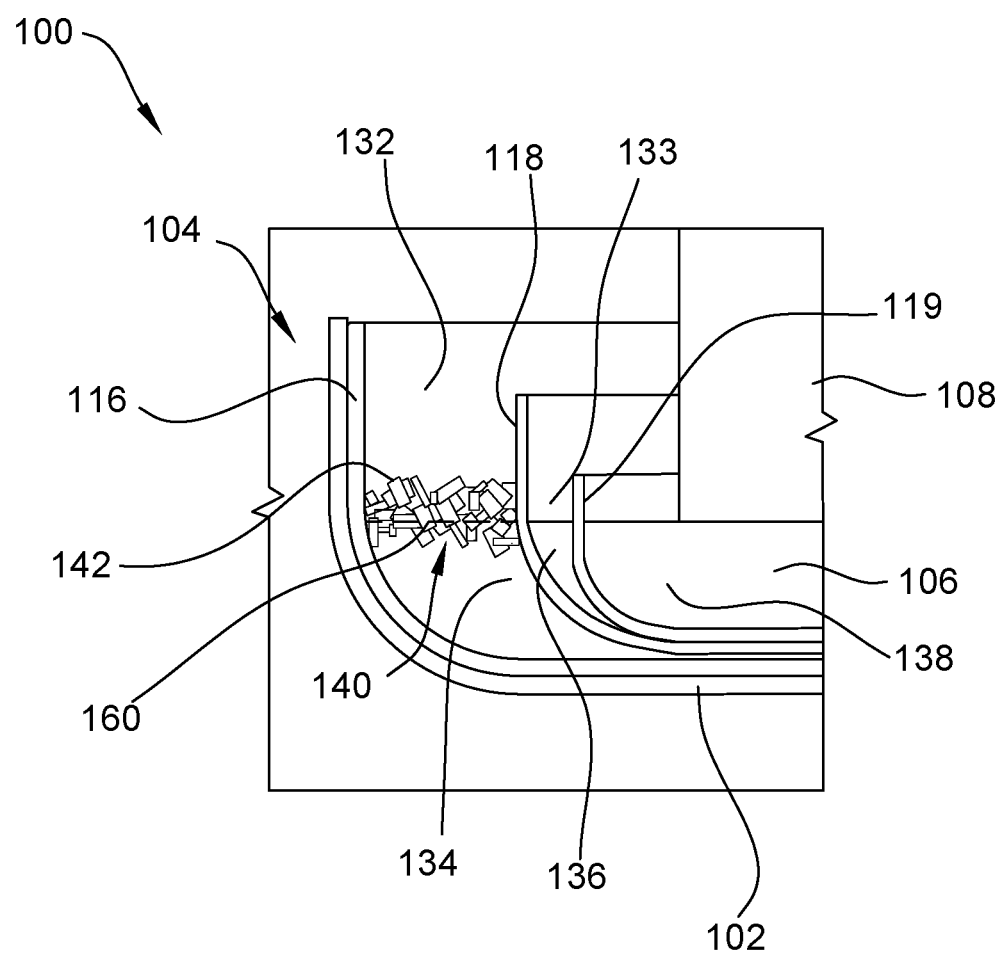
FIG. 2 is a schematic illustration of a portion of the crystal pulling system shown in FIG. 1.

FIG. 2 is a schematic illustration of a portion of crystal pulling system 100 including first crucible 116, second crucible 118, and third crucible 119. In this embodiment, bodies 142 are positioned within cavity 132. In particular, bodies 142 are positioned within outer zone 134 at a melt line 160 of solid feedstock material 111 and melt 106. Melt line 160 is defined by the surface of melt 106. Bodies 142 are arranged to reduce the number of micro-voids in melt 106. As shown in FIG. 2, barrier 140 includes bodies 142 made of quartz. As a result, bodies 142 inhibit the formation of micro-voids and may prevent contamination of melt 106. In other embodiments, system 100 may include any body 142 that enables system 100 to operate as described. For example, in some embodiments, bodies 142 may be different materials.

Bodies 142 may be any size and shape that enables system 100 to operate as described. For example, in some embodiments, bodies 142 may be cuboid, conical, cylindrical, spherical, prismatic, pyramidal, and any other suitable shape. In some embodiments, at least some bodies 142 may be different shapes and sizes. For example, in suitable embodiments, at least some bodies 142 have a non-uniform shape.

Figure 3:
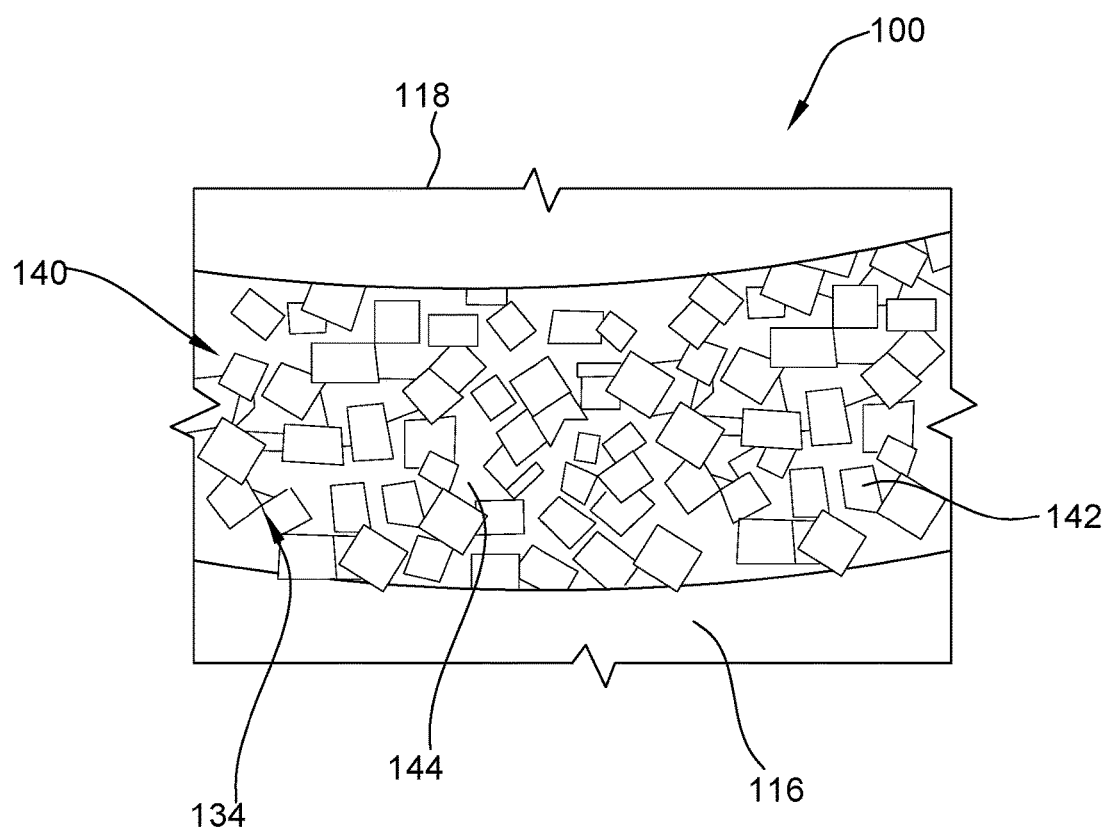
FIG. 3 is a plan view of a portion of the crystal pulling system shown in FIG. 1.
Figure 4:
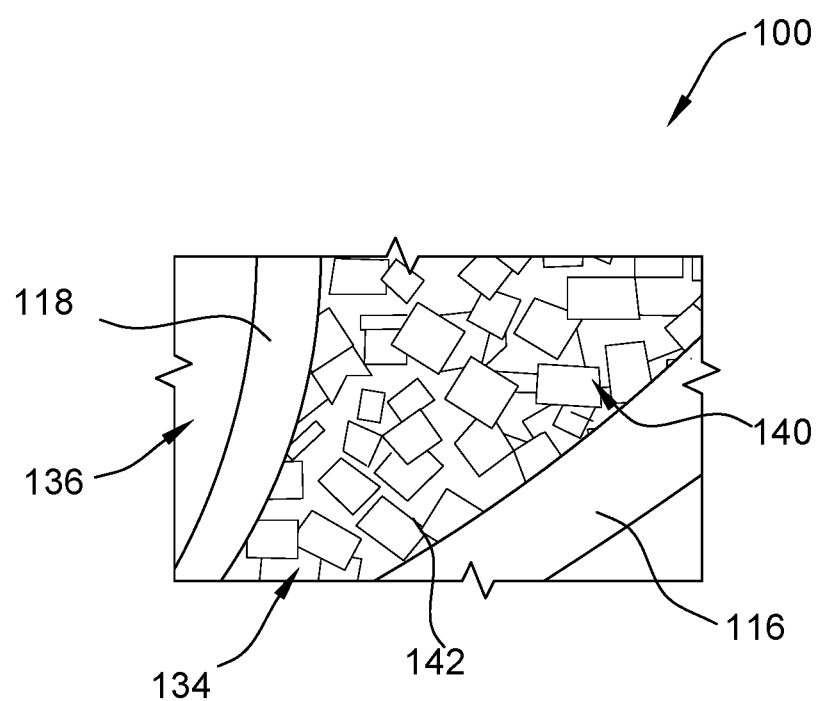
FIG. 4 is a cross-section of a portion of the crystal pulling system shown in FIG. 1.

As shown in FIGS. 3 and 4, bodies 142 are positioned within outer zone 134 between first crucible 116 and second crucible 118. In particular, bodies 142 are packed tightly together and the bodies 142 extend continuously from first crucible 116 to second crucible 118. In other embodiments, bodies 142 may be positioned in any manner that enables system 100 to operate as described.

Figure 5:
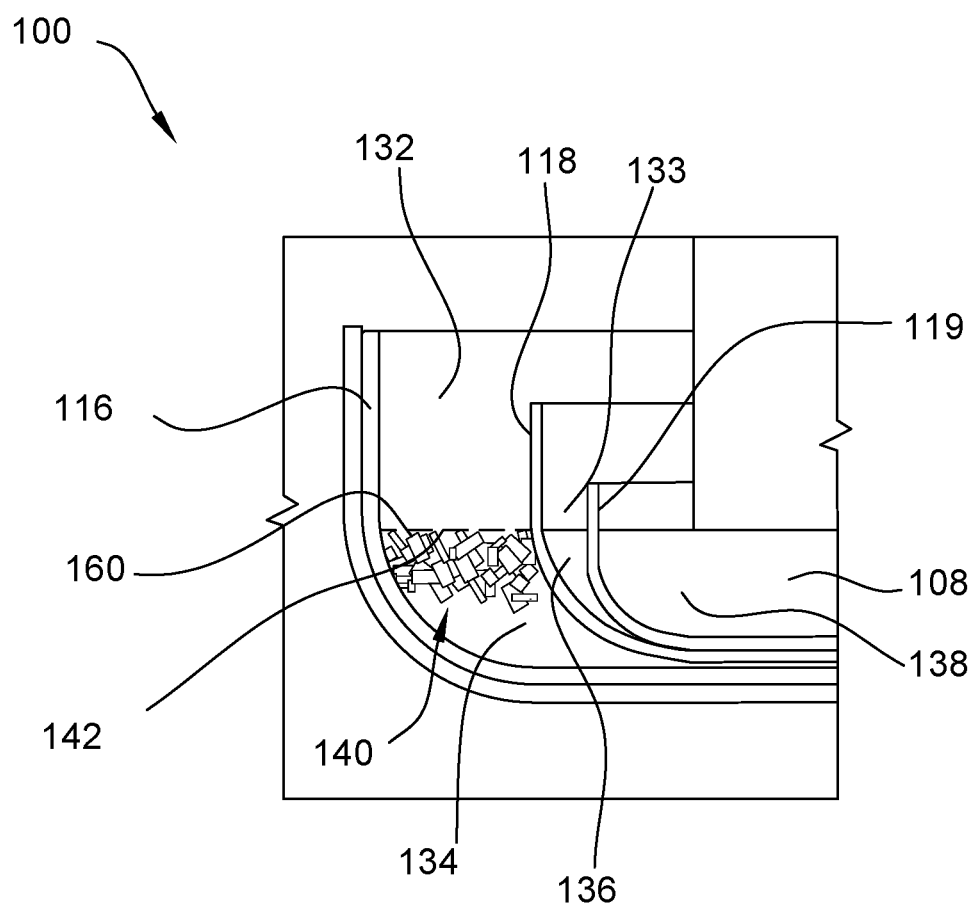
FIG. 5 is a schematic illustration of another configuration of the crystal pulling system shown in FIG. 1.

FIG. 5 is a schematic illustration of another configuration of system 100. In the configuration shown in FIG. 5, bodies 142 are positioned at melt line 160 but do not extend substantially above melt line 160. Bodies 142 are arranged to reduce direct contact between bodies 142 and feedstock material 111 added to system 100. As a result, the consumption of bodies 142 during operation of system 100 may be reduced. In addition, any variability in the surface of melt 106 may be reduced and doping efficiency changes due to bodies 142 may be reduced.

Figure 6:
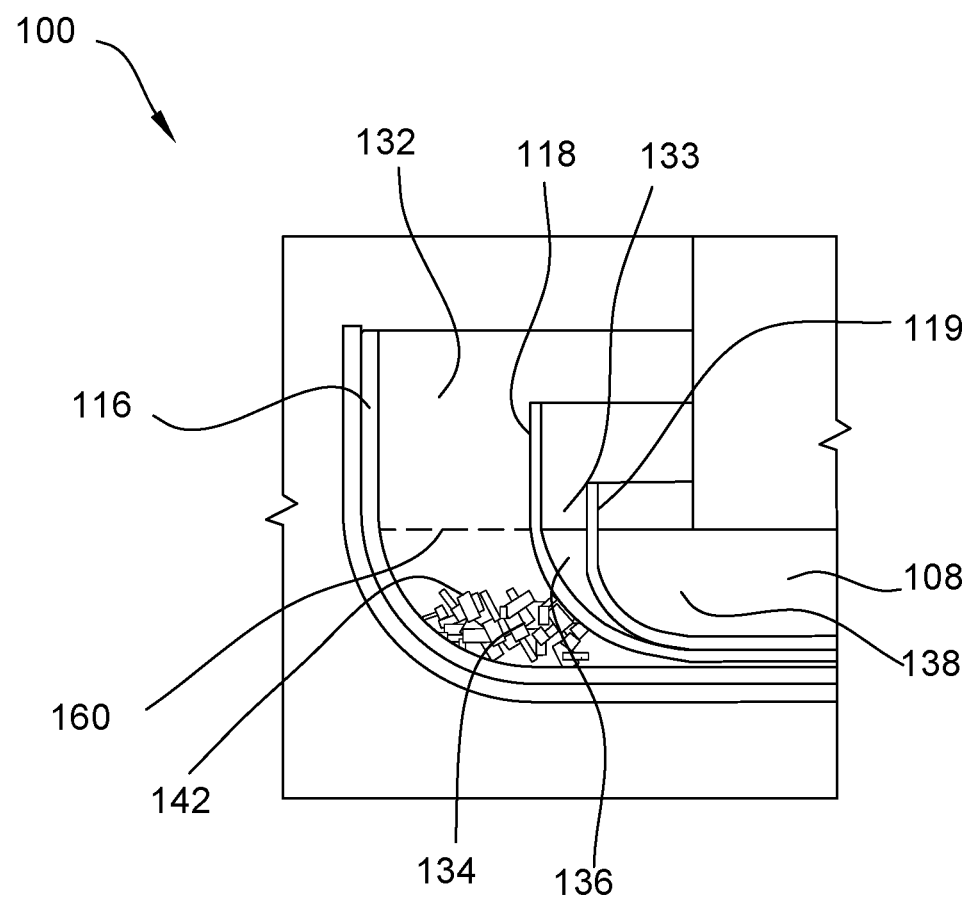
FIG. 6 is a schematic illustration of another configuration of the crystal pulling system shown in FIG. 1.

FIG. 6 is a schematic illustration of another configuration of system 100. In the configuration shown in FIG. 6, bodies 142 are disposed below and spaced from melt line 160. As a result, the consumption of bodies 142 during operation of system 100 is reduced in comparison to configurations where the bodies 142 extend to melt line 160.

Figure 7:
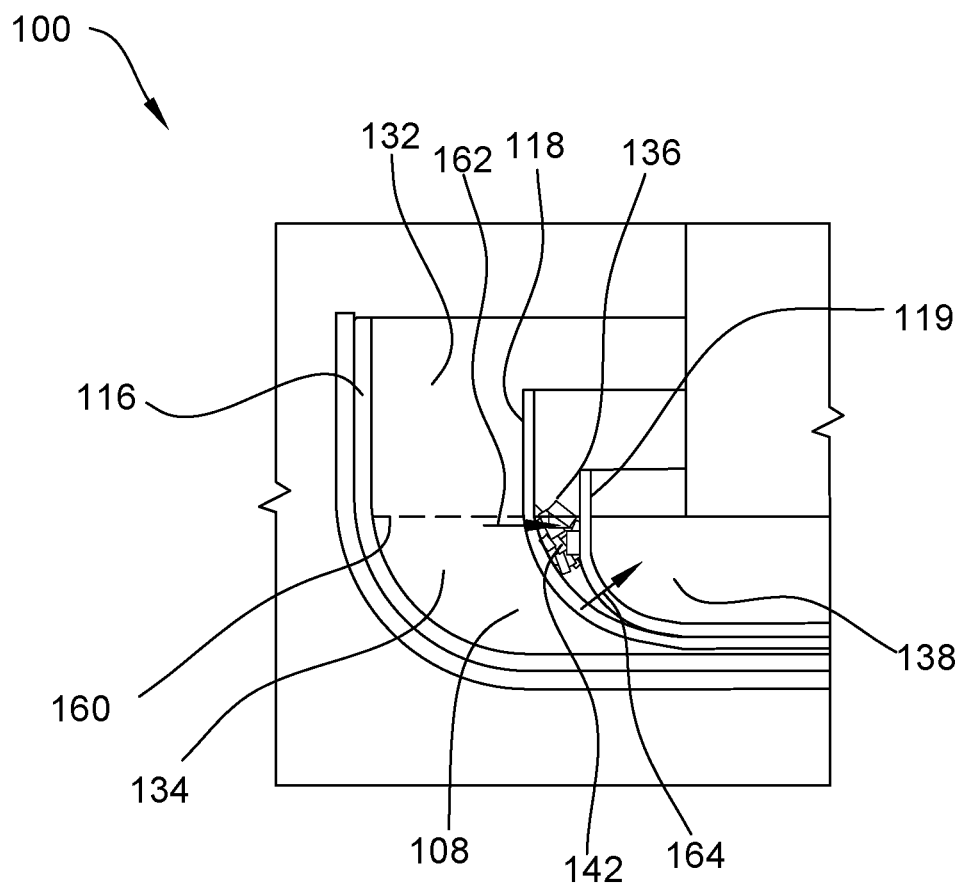
FIG. 7 is a schematic illustration of another configuration of the crystal pulling system shown in FIG. 1.

FIG. 7 is a schematic illustration of another configuration of system 100. In the configuration shown in FIG. 7, bodies 142 are positioned within transition zone 136. As a result, the consumption rate of bodies 142 during operation of system 100 is reduced. In addition, the amount of bodies 142 disposed in transition zone 136 is less than the amount of bodies 142 disposed in outer zone 134 in other configurations because the volume of transition zone 136 is less than the volume of outer zone 134. In addition, positioning bodies 142 within transition zone 136 allows outer zone 134 to be used exclusively for positioning feedstock material and supplying dopant within cavity 132. As a result, variability in the efficiency of dopants used in system 100 is reduced. In addition, the consistency of surface conditions of melt 106 is increased.

In the configuration shown in FIG. 7, second crucible 118 includes a first passageway 162 and third crucible 119 includes a second passageway 164. First passageway 162 and second passageway 164 allow feedstock material 111 and melt 106 to move from outer zone 134 into transition zone 136, through transition zone 136, and from transition zone 136 into inner zone 138. In other embodiments, system 100 may include any passageway that enables system 100 to operate as described.

In this embodiment, first passageway 162 is positioned near the surface of melt 106 and second passageway 164 is positioned near the base of third crucible 119. Accordingly, melt 106 flows through transition zone 136 in a generally downward direction in reference to the orientation of system 100 shown in FIG. 7. As a result, melt 106 contacts an increased number of bodies 142 within transition zone 136.

Figure 8:
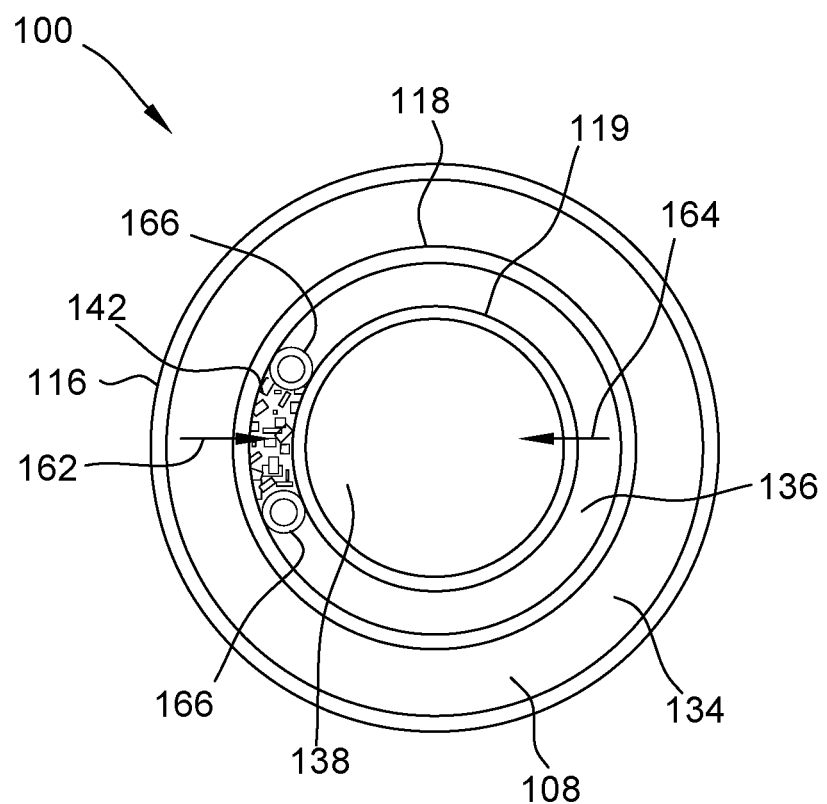
FIG. 8 is a schematic plan view of another configuration of the crystal pulling system shown in FIG. 1.
Figure 9:
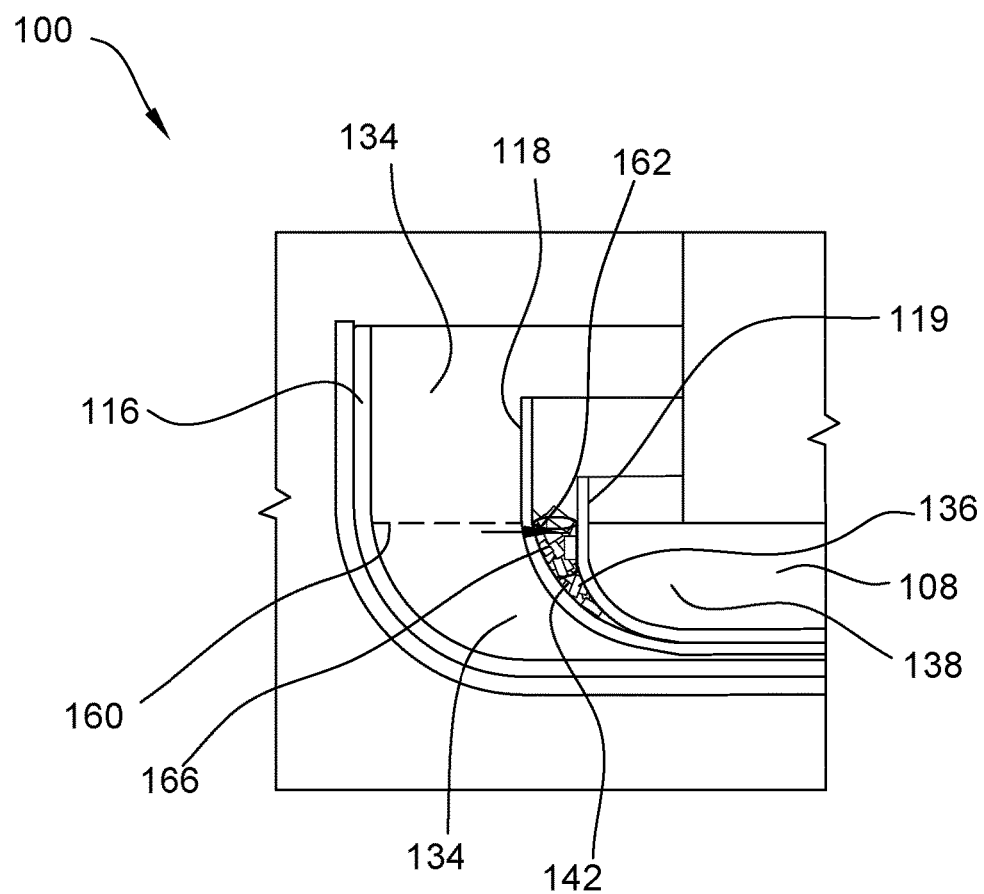
FIG. 9 is a schematic illustration of a portion of the crystal pulling system in the configuration shown in FIG. 8.

FIGS. 8 and 9 are schematic illustrations of another configuration of system 100. System 100 further includes supports 166. In this embodiment, supports 166 and bodies 142 are positioned within transition zone 136. In particular, bodies 142 are positioned adjacent first passageway 162 to increase contact between bodies 142 and melt 106. Supports 166 are spaced apart within transition zone 136 on opposite sides of first passageway 162. Accordingly, supports 166 maintain bodies 142 in position adjacent first passageway 162. In addition, supports 166 reduce the amount of bodies 142 used in system 100 because bodies are positioned only in portions of transition zone 136 adjacent first passageway 162. In other embodiments, bodies 142 and supports 166 are arranged in any manner that enables system 100 to operate as described.

In this embodiment, supports 166 are hollow cylinders and have a diameter substantially equal to the distance between second crucible 118 and third crucible 119. In addition, supports 166 have a length that is greater than a depth of melt 106 in transition zone 136. In other embodiments, supports 166 may have different shapes and sizes. Also, supports 166 may be constructed from any material. In this embodiment, supports 166 are constructed from quartz to reduce contamination of melt 106.

Figure 10:
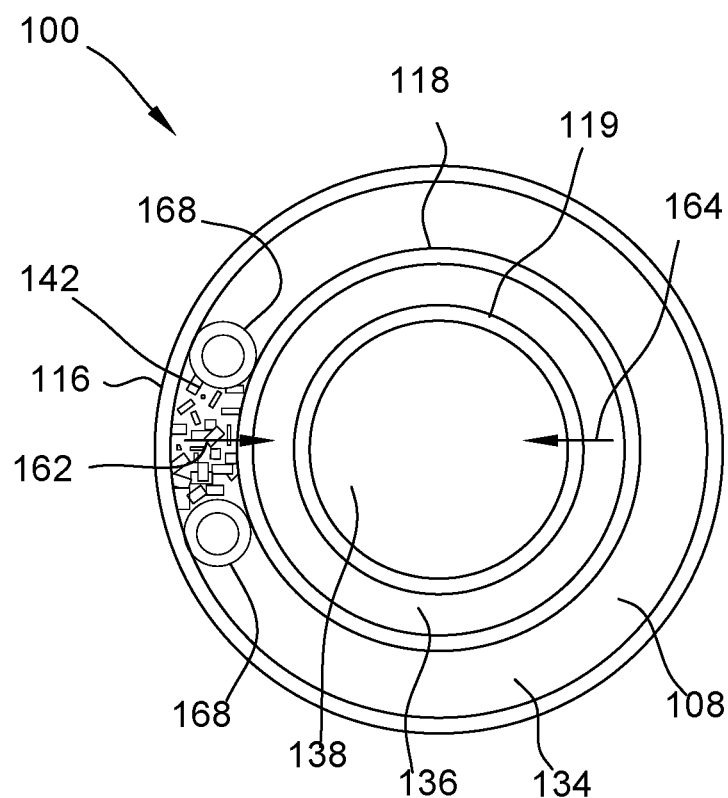
FIG. 10 is a schematic plan view of another configuration of the crystal pulling system shown in FIG. 1.
Figure 11:
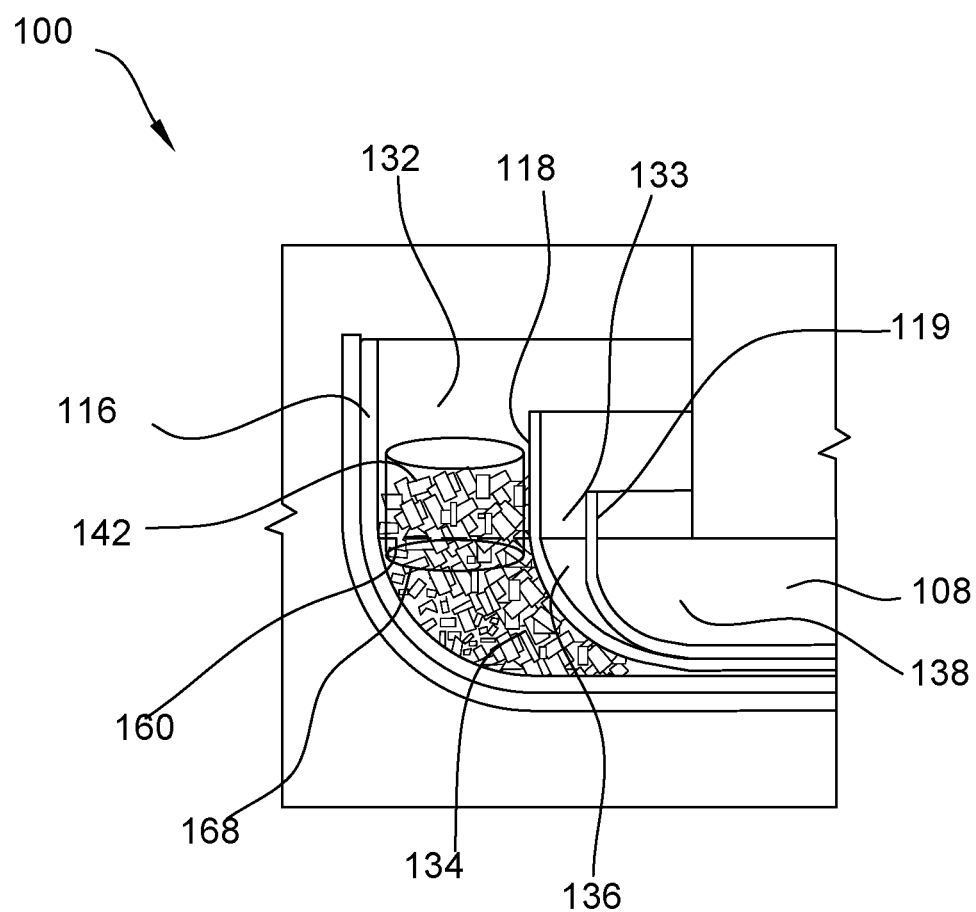
FIG. 11 is a schematic illustration of a portion of the crystal pulling system in the configuration shown in FIG. 10.

FIGS. 10 and 11 are schematic illustrations of another configuration of system 100. System 100 further includes supports 168. Supports 168 and bodies 142 are positioned within outer zone 134. In particular, bodies 142 are positioned adjacent first passageway 162 to increase contact between bodies 142 and melt 106. Supports 168 are spaced apart within outer zone 134 on opposite sides of first passageway 162. Accordingly, supports 168 maintain bodies 142 in position adjacent first passageway 162. In addition, supports 168 reduce the amount of bodies 142 used in system 100 because bodies 142 are arranged only in portions of outer zone 134 adjacent first passageway 162. In other embodiments, bodies 142 and supports 168 are arranged in any manner that enables system 100 to operate as described.

In this embodiment, supports 168 are hollow cylinders and have a diameter substantially equal to the distance between first crucible 116 and second crucible 118. In this embodiment, supports 168 extend adjacent a base of first crucible 116 and above the surface of melt 106. In addition, in some embodiments, supports 168 have a length that is greater than a depth of melt 106 in outer zone 134. In other embodiments, supports 168 may have different shapes and sizes. Also, supports 168 may be constructed from any material. In this embodiment, supports 168 are constructed from quartz to reduce contamination of melt 106.

Figure 12:
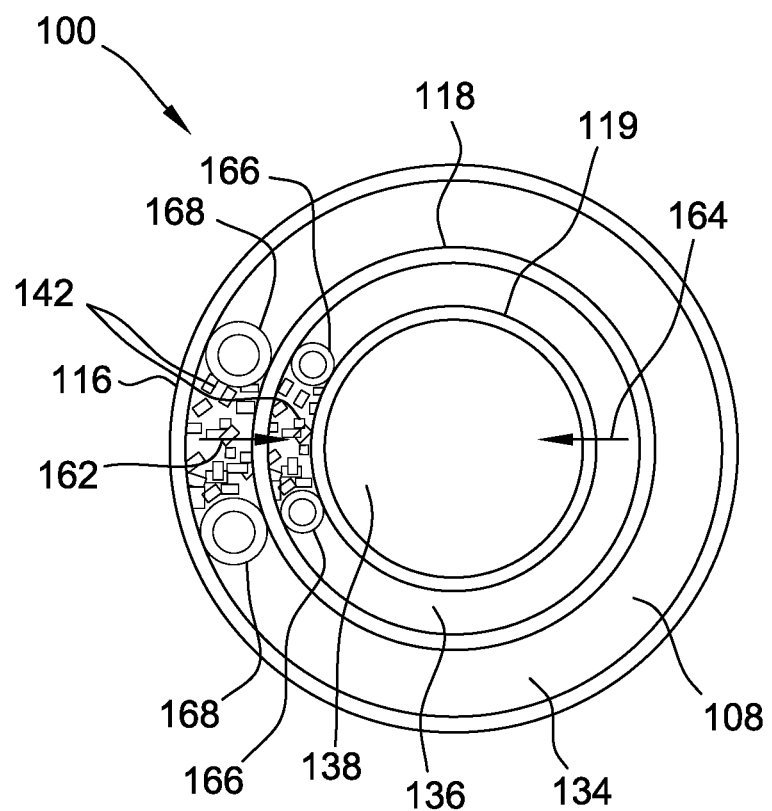
FIG. 12 is a schematic plan view of another configuration of the crystal pulling system shown in FIG. 1.
Figure 13:
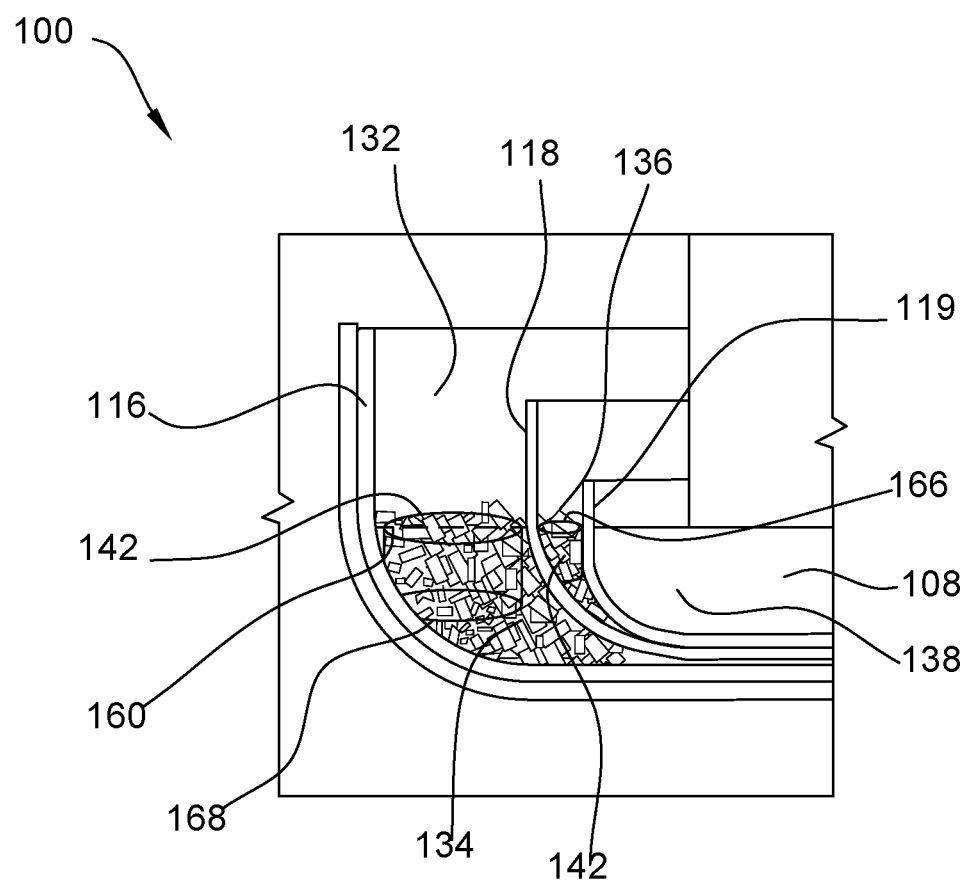
FIG. 13 is a schematic illustration of a portion of the crystal pulling system in the configuration shown in FIG. 12.

FIGS. 12 and 13 are schematic illustrations of another configuration of system 100. In this configuration, system 100 includes supports 166 and supports 168. Supports 166 are positioned within transition zone 136 and supports 168 are positioned within outer zone 134. Bodies 142 are positioned within transition zone 136 between supports 166. In addition, bodies 142 are positioned within outer zone 134 between supports 168. Within transition zone 136 and outer zone 134, bodies 142 are positioned adjacent first passageway 162. In this embodiment, supports 166, 168 and bodies 142 provide increased contact between melt 106 and bodies 142 because bodies contact melt 106 that flows through first passageway 162. In addition, supports 166 and 168 reduce the amount of bodies 142 used in system 100 because bodies 142 are positioned only in portions of outer zone 134 and transition zone 136 adjacent first passageway 162. In other embodiments, bodies 142 and supports 166, 168 may be arranged in any manner that enables system 100 to operate as described.

Figure 14:
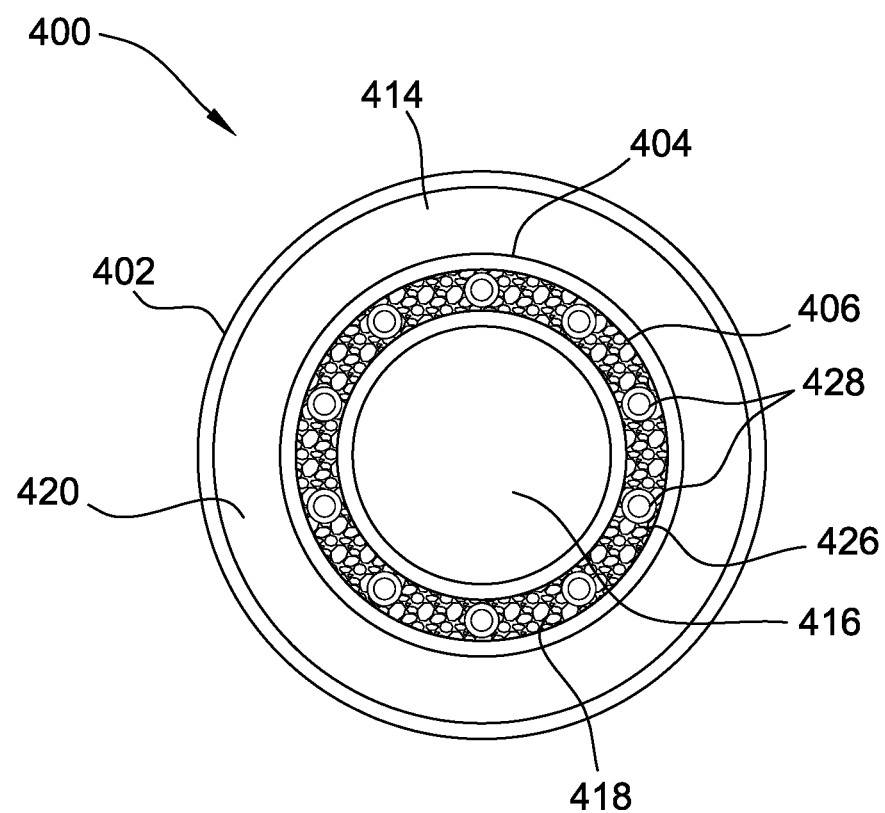
FIG. 14 is a schematic plan view of a portion of a crystal pulling system including a weir and an inner crucible.
Figure 15:
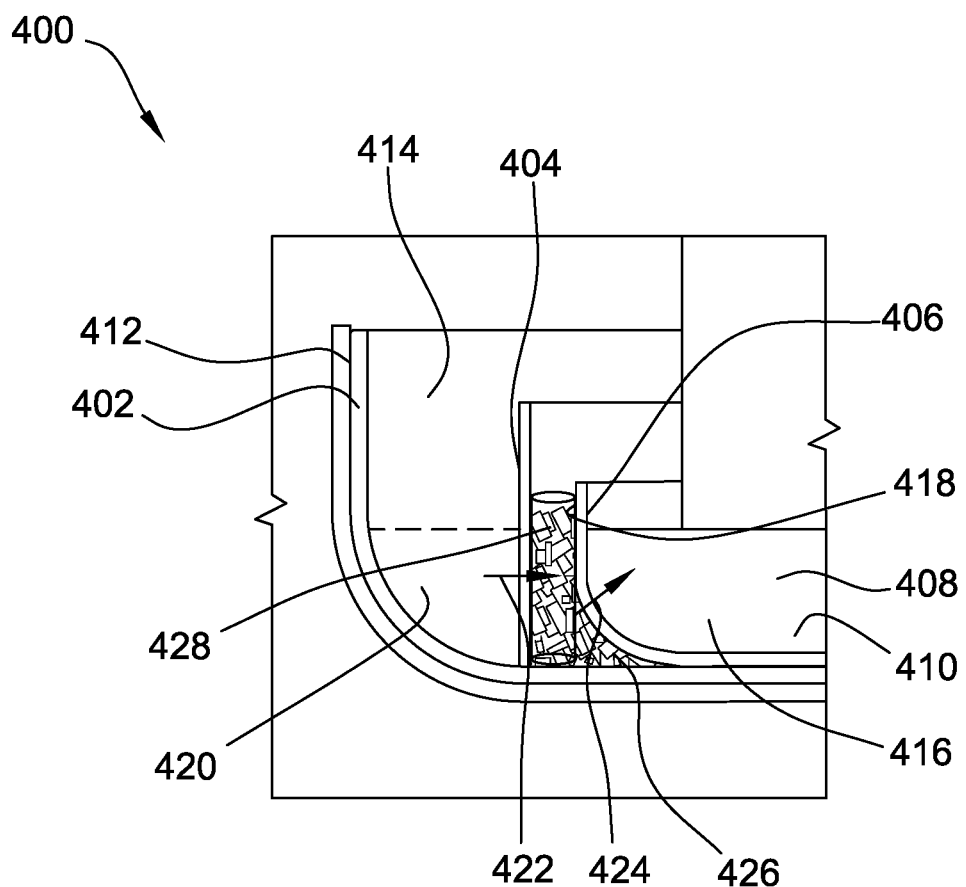
FIG. 15 is a schematic illustration of a portion of the crystal pulling system shown in FIG. 14.

FIG. 14 is a schematic plan view of a portion of a crystal pulling system 400. FIG. 15 is a schematic illustration of a portion of crystal pulling system 400. In this embodiment, system 400 includes an outer crucible 402, a weir 404, and an inner crucible 406. Outer crucible 402 is arranged to receive a melt 408 and includes a base 410 and a sidewall 412 defining a cavity 414. Inner crucible 406 and weir 404 are located in cavity 414 of crucible 402. Inner crucible 406 circumscribes an inner zone 416. Inner crucible 406 and weir 404 define a transition zone 418 therebetween. In addition, weir 404 and outer crucible 402 define an outer zone 420 therebetween.

In operation, crystal pulling system 400 forms an ingot from melt 408 by lowering and raising a seed crystal in a growth area of inner zone 416. A passageway 422 is defined through inner crucible 406 for melt 408 to move from transition zone 418 into inner zone 416. In addition, a passageway 424 is defined through weir 404 for melt 408 to move from outer zone 420 into transition zone 418. Accordingly, weir 404 and inner crucible 406 control movement of melt 408 between outer zone 420, transition zone 418, and inner zone 416.

System 400 further includes bodies 426 positioned in transition zone 418 and arranged to reduce micro-voids in melt 408. In this embodiment, bodies 426 are stacked between weir 404 and inner crucible 406. Bodies 426 are loosely arranged in layers in transition zone 418. In other embodiments, bodies 426 may be arranged in any manner that enables system 400 to operate as described.

In this embodiment, supports 428 are positioned between weir 404 and inner crucible 406 within transition zone 418. Supports 428 reduce the amount of bodies 426 positioned within transition zone 418 and maintain the position of bodies 426. Supports 428 are spaced throughout transition zone 418. In particular, supports 428 are offset from passageways 422, 424 such that bodies 426 are aligned with and positioned adjacent passageways 422, 424. In other embodiments, supports 428 are positioned in any manner that enables system 400 to operate as described.

System 400 may include any supports 428 that enable system 400 to operate as described. In this embodiment, supports 428 are hollow cylinders. In some embodiments, supports 428 have a diameter substantially equal to the distance between weir 404 and inner crucible 406. In addition, in some embodiments, supports 428 have a length that is greater than a depth of melt 408 in transition zone 418. In other embodiments, supports 428 may have different shapes and sizes. Also, supports 428 may be constructed from any materials. In this embodiment, supports 428 are constructed from quartz to reduce contamination of melt 408.

Figure 16:
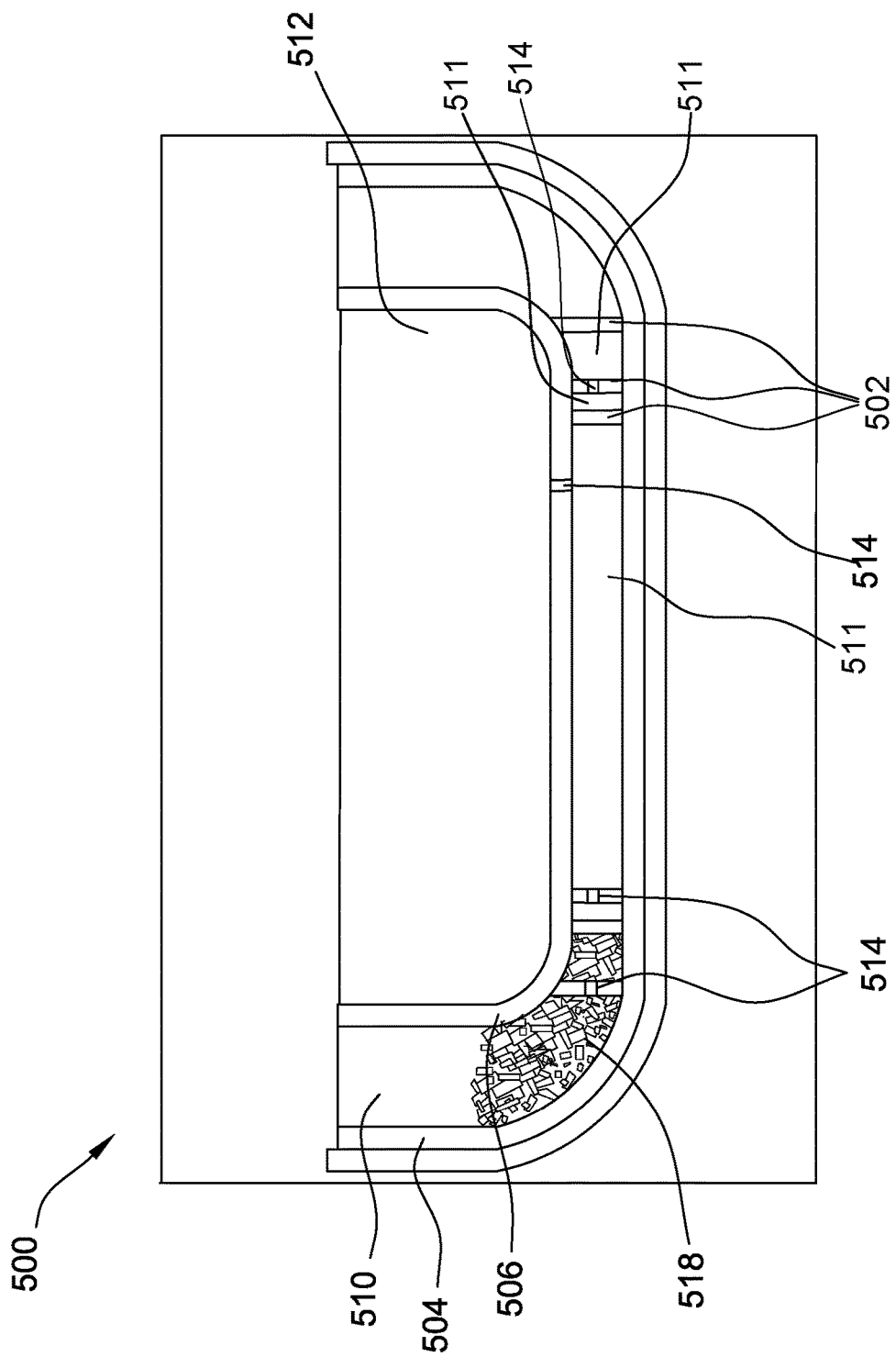
FIG. 16 is a schematic illustration of a crystal pulling system including an inner crucible.

FIG. 16 is a schematic illustration of a crystal pulling system 500 including at least one barrier ring 502. Crystal pulling system 500 also includes a first crucible 504 and a second crucible 506. Crystal pulling system 500 may be used to form an ingot from a melt contained in first crucible 504 and second crucible 506. Second crucible 506 and barrier rings 502 are positioned in a cavity of first crucible 504 such that first crucible 504, second crucible 506, and an outer barrier ring 502 form an outer zone 510 therebetween. In addition, first crucible 504, second crucible 506, and barrier rings 502 form transition zones 511. In this embodiment, crystal pulling system 500 includes three barrier rings 502 forming three transition zones 511. Specifically, barrier rings 502 include an outer barrier ring 502, an intermediate barrier ring 502, and an inner barrier ring 502 forming an outer transition zone 511, an intermediate transition zone 511, and an inner transition zone 511. Barrier rings 502 are nested within each other in order of descending diameter. In other embodiments, crystal pulling system 500 may include any number of barrier rings 502 forming any transition zones 511 that enable crystal pulling system 500 to operate as described.

As the melt is heated, the melt moves from outer zone 510, through transition zones 511, and towards an inner zone 512 where the ingot is formed. Barrier rings 502 extend adjacent a base of second crucible 506 to inhibit the melt moving from outer zone 510 into inner zone 512. Barrier rings 502 and second crucible 506 include respective passageways 514 for the melt to flow from outer zone 510, through transition zones 511, and into inner zone 512. Suitably, passageways 514 in barrier rings 502 and second crucible 506 are offset such that the melt flows through a circuitous path from outer zone 510 into inner zone 512. In other embodiments, system 500 may include any suitable passageway that enables system 500 to operate as described.

In this embodiment, system 500 further includes bodies 518 disposed in outer zone 510 and transition zones 511. In this embodiment, bodies 518 are positioned adjacent and within outer barrier ring 502 and in outer transition zone 511. Accordingly, the amount of bodies 518 used in system 500 may be reduced because bodies 518 are positioned only in portions of the cavity adjacent passageways 514. In addition, the consumption of bodies 518 during operation of system 500 is reduced. In other embodiments, system 500 may include any bodies 518 that enable system 500 to operate as described.

In suitable embodiments, bodies 518 and barrier ring 502 may be constructed from any material that enables system 500 to operate as described. In this embodiment, barrier ring 502 and bodies 518 are constructed from quartz to reduce contamination of the melt.

Figure 17:
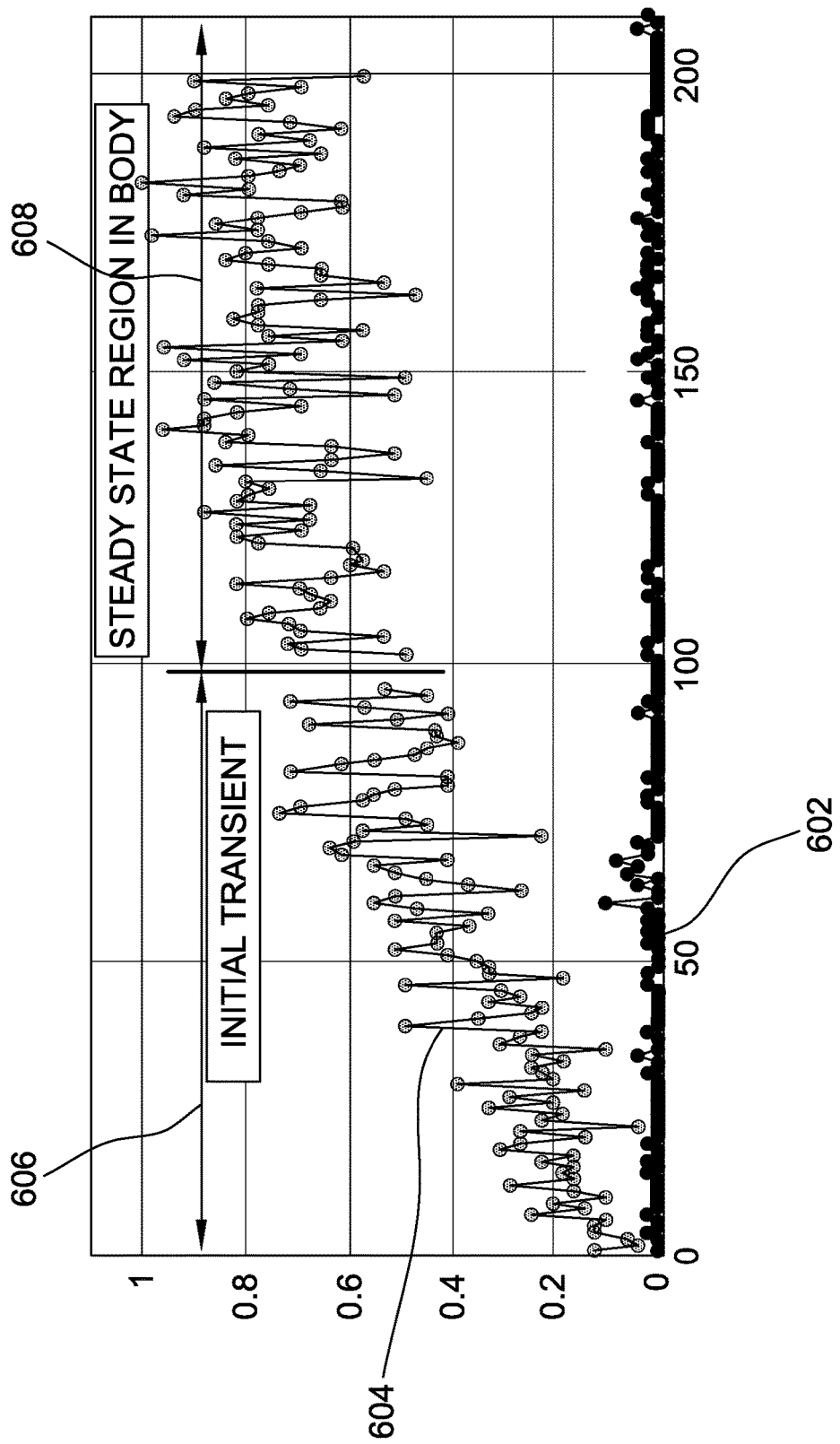
FIG. 17 is a graph comparing normalized area counts of ingots.

FIG. 17 is a graph comparing normalized area counts of ingots. A first curve 602 represents normalized area counts for an ingot formed using a crystal pulling system including conditioning members. A second curve 604 represents an ingot formed using a crystal pulling system without conditioning members. As illustrated in FIG. 17, first curve 602 has substantially less area counts than second curve 604. A majority of these area counts can be attributed to micro-voids in a melt because the area counts displayed micro-void morphology.

Second curve 604 includes a first portion 606 and a second portion 608. Within first portion 606, the area counts increase at an approximately steady rate. Within second portion 608, the area counts are substantially constant. Accordingly, during initial ingot growth, the melt is free of micro-voids. However, in the system represented by second curve 604, micro-voids are formed when feedstock material is introduced into the system and the number of micro-voids increase until a steady state value is reached. In contrast, first curve 602 is substantially constant, which indicates that micro-voids were not formed or if formed were eliminated during the operation of the system including conditioning members.

First curve 602 has a substantially lower number of area counts than second curve 604. Accordingly, average area counts per wafer will be substantially less for the ingot represented by first curve 602 than for the ingot represented by second curve 604. For example, the first ingot may produce wafers having an average area count of less than 0.05 normal units. In contrast, the second ingot may produce wafers having an average area count during steady state body growth in a range of about 0.4 to about 1 normal units.

Figure 18:
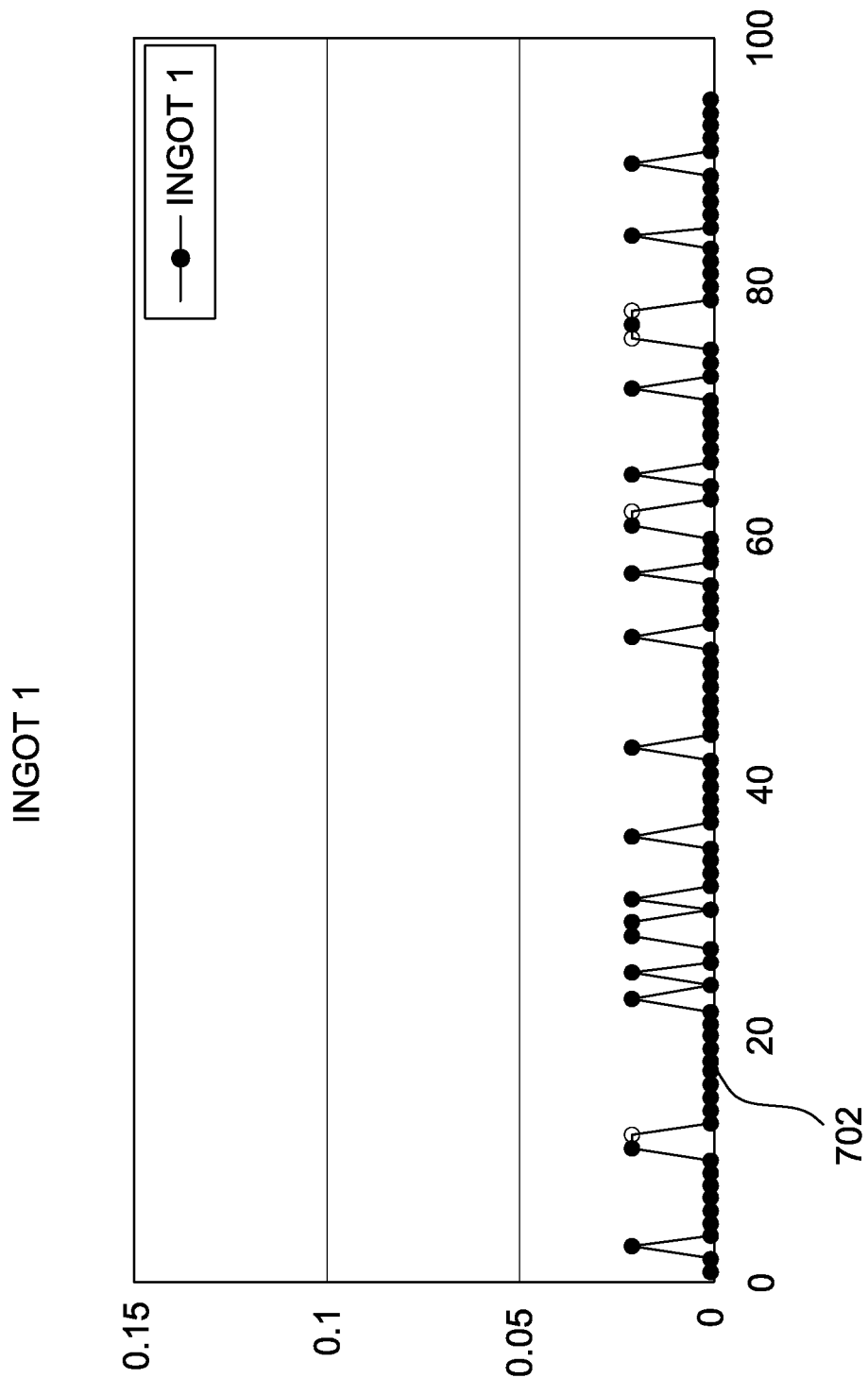
FIG. 18 is a graph of normalized area counts of an ingot.
Figure 19:
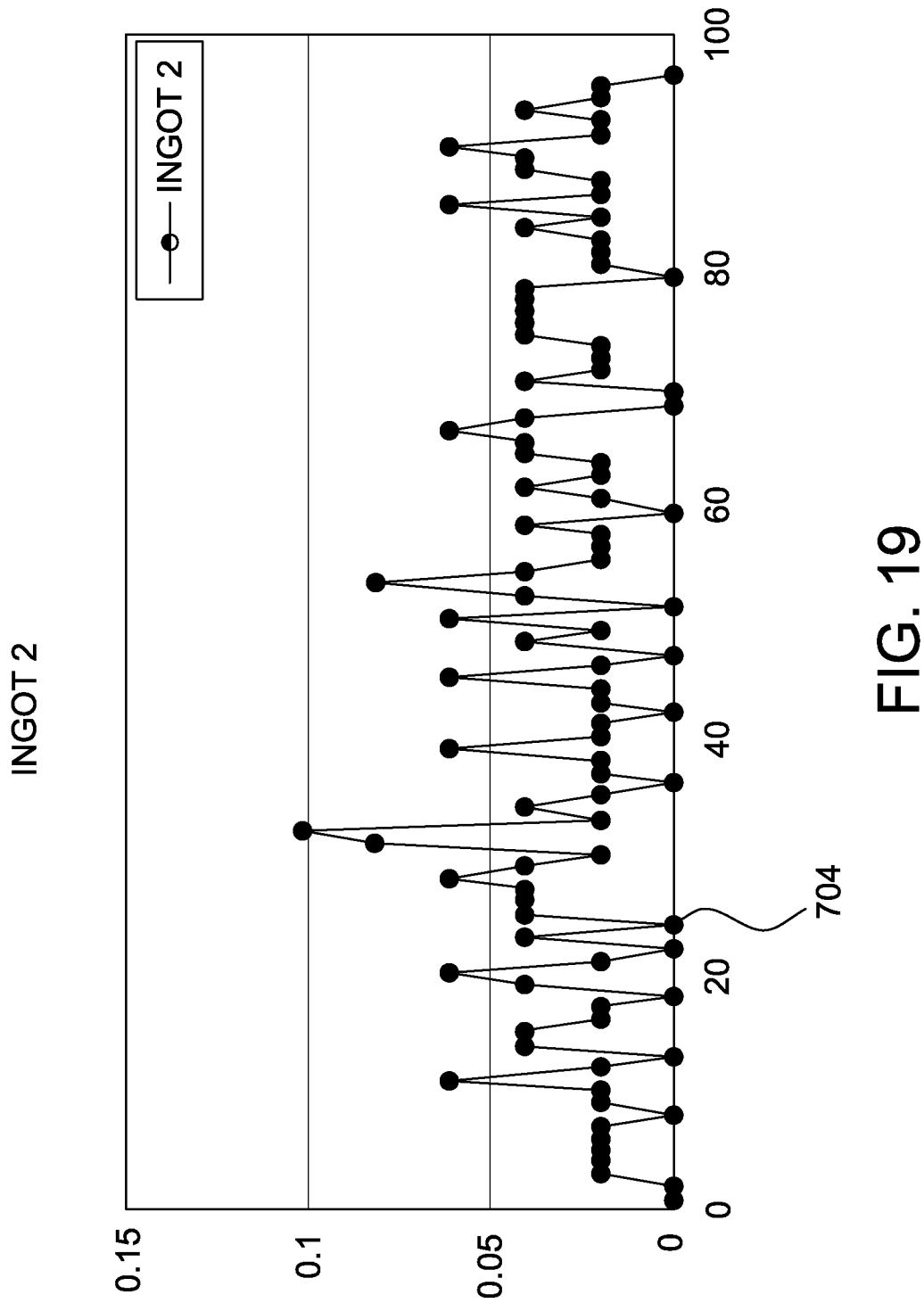
FIG. 19 is a graph of normalized area counts of an ingot.
Figure 20:
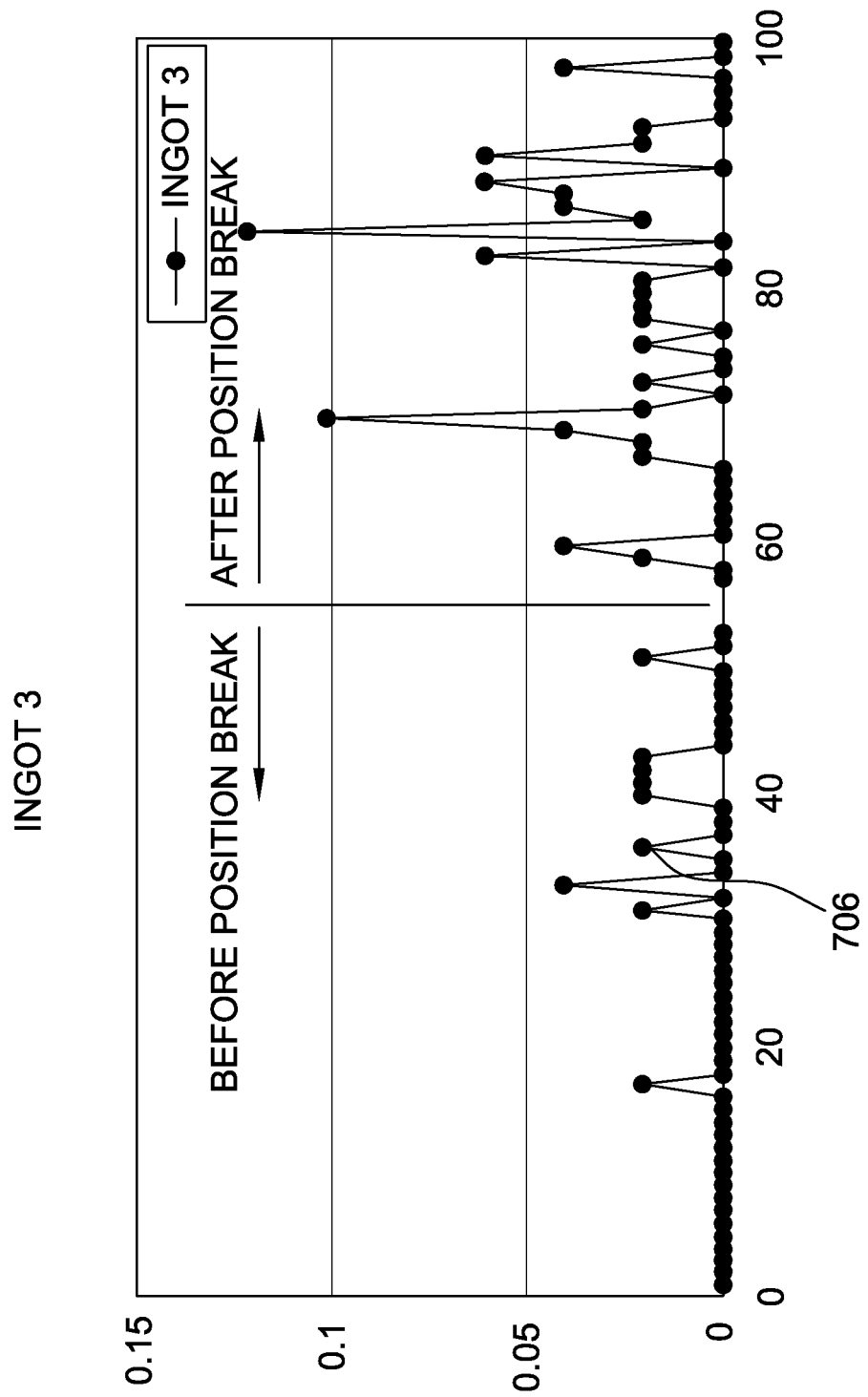
FIG. 20 is a graph of normalized area counts of an ingot.

FIGS. 18-20 are graphs comparing normalized area counts of ingots formed using described embodiments. Each graph includes an X-axis with wafer numbers from 1 to 100 and a Y-axis with area counts from 0 to 0.15 normal units. Curves 702, 704, 706 illustrate area counts for wafers formed from middle sections of a first ingot, a second ingot, and a third ingot, respectively.

The first ingot was formed using a system including quartz bodies. Curve 702 illustrates that wafers formed from the first ingot have area counts less than 0.05 normal units. The second ingot was formed using the same system as the first ingot without replenishing the quartz bodies. Accordingly, a majority of the quartz bodies where consumed prior to formation of the second ingot. Curve 704 illustrates that wafers formed from the second ingot had higher area counts than the wafers formed from the first ingot. However, the wafers formed from the second ingot still had area counts of about 0.1 normal units or less. The third ingot was formed using the same system as the first ingot and the second ingot with quartz bodies being added to the system after formation of the second ingot. However, the quartz bodies were at least partially consumed during the formation of the third ingot. Accordingly, the area counts of the wafers formed from the third ingot are initially less than 0.05 but increase in correlation to formation of the ingot. The maximum area counts of the wafers formed from the third ingot are less than 0.15. Accordingly, the quartz bodies clearly have an effect on micro-void performance and area counts of a formed ingot. In particular, the systems including the quartz bodies produce ingots having reduced area counts in comparison to system without quartz bodies.

Figure 21:
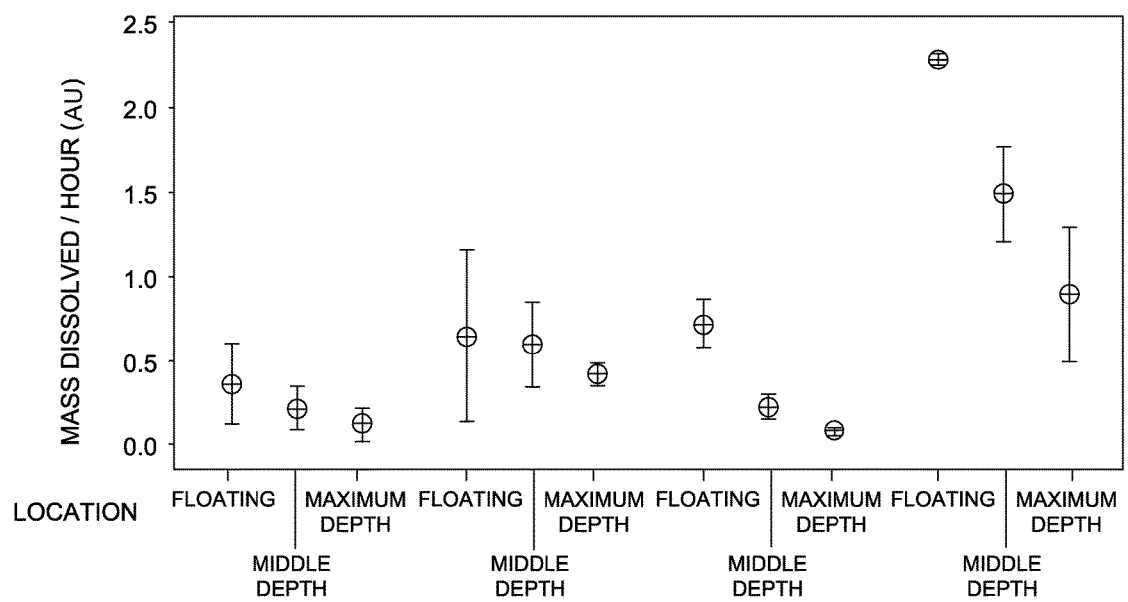
FIG. 21 is a graph showing the mass of bodies dissolved for different configurations of a crystal pulling system.

FIG. 21 is a graph showing the mass of bodies dissolved for different configurations of a crystal pulling system. As illustrated in FIG. 21, the rate of consumption of the bodies changes relative to the depth of the bodies from the surface of a melt. In particular, the rate of consumption and the depth are inversely proportional. In other words, the rate of consumption increases as the depth of the bodies decreases. For each system, the highest rate of consumption occurred when the bodies were floating on the surface of the melt. Accordingly, in some embodiments, the bodies may be disposed at a greater depth to reduce the consumption of the bodies. In such embodiments, the bodies may limit micro-void formation without being disposed at the surface of the melt. In further embodiments, the bodies may be disposed closer to the surface of the melt and bodies may be added during operation of system to account for the increased rate of consumption.

Systems and methods in accordance with the examples described above achieve superior results compared to known systems and methods. The disclosed systems and methods reduce the number of micro-voids in a melt during operation of a crystal pulling system. The disclosed systems and methods include bodies that can inhibit the formation of micro-voids in the melt and remove micro-voids that are formed in the melt.

Also, the systems and methods described above provide a larger growth area for a single silicon crystal, while minimizing the cost of the system. As a result, the size of the single silicon crystal formed by the system may be increased in comparison to some known systems.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A system for forming an ingot from a melt, the system comprising:
   a crucible defining a cavity for receiving the melt;
   a first barrier disposed in the cavity to inhibit movement of the melt, the crucible and the first barrier forming an outer zone, the first barrier including a first passageway;
   a second barrier disposed in the cavity to inhibit movement of the melt from outward of the second barrier to inward of the second barrier, the first barrier and the second barrier defining a transition zone therebetween, the second barrier forming an inner zone and including a second passageway, wherein the first passageway and the second passageway are arranged to allow the melt located within the outer zone to move into and through the transition zone and into the inner zone; and
   conditioning members including bodies positioned in the transition zone between the first barrier and the second barrier, the conditioning members being arranged to contact the melt in the transition zone and reduce the number of micro-voids in the melt.

2. The system of claim 1, wherein the conditioning members include bodies constructed of quartz.

3. The system of claim 1, further comprising spacers positioned in the transition zone and arranged to support the conditioning members within the transition zone.

4. The system of claim 1 further comprising a feeder system to deliver solid feedstock material into the cavity, wherein the solid feedstock material is arranged to form the melt.

5. The system of claim 4, wherein the conditioning members are positioned throughout the transition zone from the first barrier to the second barrier at a melt line defined by a surface of the melt such that the melt contacts the conditioning members as the solid feedstock material melts.

6. The system of claim 5, wherein the conditioning members are further arranged to extend above the melt line.

7. The system of claim 6, wherein the conditioning members are further arranged to extend below the melt line.

8. The system of claim 1, wherein the crucible is a first crucible and the first barrier is a second crucible, the outer zone being formed by the first crucible and the second crucible.

9. The system of claim 8, wherein the second barrier is a third crucible forming the inner zone, the transition zone being formed by the third crucible and the second crucible.

10. The system of claim 1, wherein the first and second barriers are weirs separating the outer zone, the transition zone, and the inner zone, the weirs including the first and second passageways therethrough to allow the melt located within the outer zone to move into the inner zone, wherein the inner zone defines a growth area for the ingot, the conditioning members being positioned in the outer zone and the transition zone.

11. The system of claim 1, wherein the conditioning members include at least one of the following shapes: cuboid, conical, cylindrical, spherical, prismatic, and pyramidal.

* * * * *